United States Patent [19]

Toyoda

[11] Patent Number: 4,459,686
[45] Date of Patent: Jul. 10, 1984

[54] SEMICONDUCTOR DEVICE

[75] Inventor: Kazuhiro Toyoda, Yokohama, Japan

[73] Assignee: Fujitsu Limited, Kawasaki, Japan

[21] Appl. No.: 310,296

[22] Filed: Oct. 9, 1981

[30] Foreign Application Priority Data

Oct. 9, 1980 [JP] Japan .................................. 55-141656

[51] Int. Cl.³ ............................................. G11C 11/40
[52] U.S. Cl. .................................... 365/201; 365/155; 365/190
[58] Field of Search ............... 365/155, 179, 190, 201, 365/202, 205, 207, 210

[56] References Cited

U.S. PATENT DOCUMENTS 4,164,791 8/1979 Homma ............................... 365/190
4,322,820 3/1982 Toyoda ............................... 365/154
4,348,747 9/1982 Takahashi ....................... 365/190 X Primary Examiner—Joseph A. Popek
Attorney, Agent, or Firm—Staas & Halsey

[57] ABSTRACT

A semiconductor device, such as a bipolar semiconductor memory device, includes an internal circuit and a reference signal generating circuit. The difference in potential between at least one internal signal produced by the internal circuit and a reference signal, which is called a noise margin, is decreased during a test mode, rather than during a usual or normal mode, so that the device artificially obtains a high temperature state at room temperature.

12 Claims, 11 Drawing Figures

SEMICONDUCTOR DEVICE

BACKGROUND OF THE INVENTION

The present invention relates to a semiconductor device, such as a bipolar semiconductor memory device.

In general, when testing a completed semiconductor device, it is desirable to conduct the test under adverse conditions. For example, a test for a semiconductor device could be carried out at a high temperature. However, when considering the fluctuation characteristics of the internal elements within the semiconductor device, such an adverse condition cannot be easily accomplished. In addition, the process for heating a chip is necessary, and a number of complex test steps are required for realizing an adverse condition, such as that of a high temperature, which causes the cost of testing of the device to be high.

SUMMARY OF THE INVENTION

Therefore, it is an object of the present invention to provide a semiconductor device in which a high temperature test can be carried out at room temperature.

According to the present invention, there is provided a semiconductor device including: an internal circuit for generating at least one internal signal and means for generating a reference signal. Also included are means, connected to the internal circuit and to the reference signal generating means, for sensing the difference in potential between the internal signal and the reference signal and means for changing the difference in potential between the internal signal and the reference signal based on a usual or normal mode and a test mode.

According to the present invention, there is also provided a semiconductor device including: a plurality of word lines, a plurality of hold lines and a plurality of pairs of bit lines. Also included are a plurality of word drivers each connected to one of the word lines and a plurality of memory cells, each including two multi-emitter transistors having bases and collectors cross-coupled as a bistable circuit and having one emitter of each such multi-emitter transistor connected to one of the bit lines and the other emitter of each such multi-emitter transistor connected to one of the hold lines. Each memory cell also includes two loads or resistors connected to the multi-emitter transistors and to one of the word lines. The semiconductor device further includes a plurality of pairs of sensing transistors having emitters connected to one of the pairs of bit lines and means, connected to the bases of the sensing transistors, for generating a read reference potential for each base of the sensing transistors. Additionally included is means for changing the difference in potential between the internal signal and the read reference potential in accordance with the usual or normal mode and the test mode.

The present invention will be more clearly understood from the following description contrasted with a conventional device and with reference to the accompanying drawings.

DESCRIPTION OF THE PREFERRED EMBODIMENTS

Figure 1:
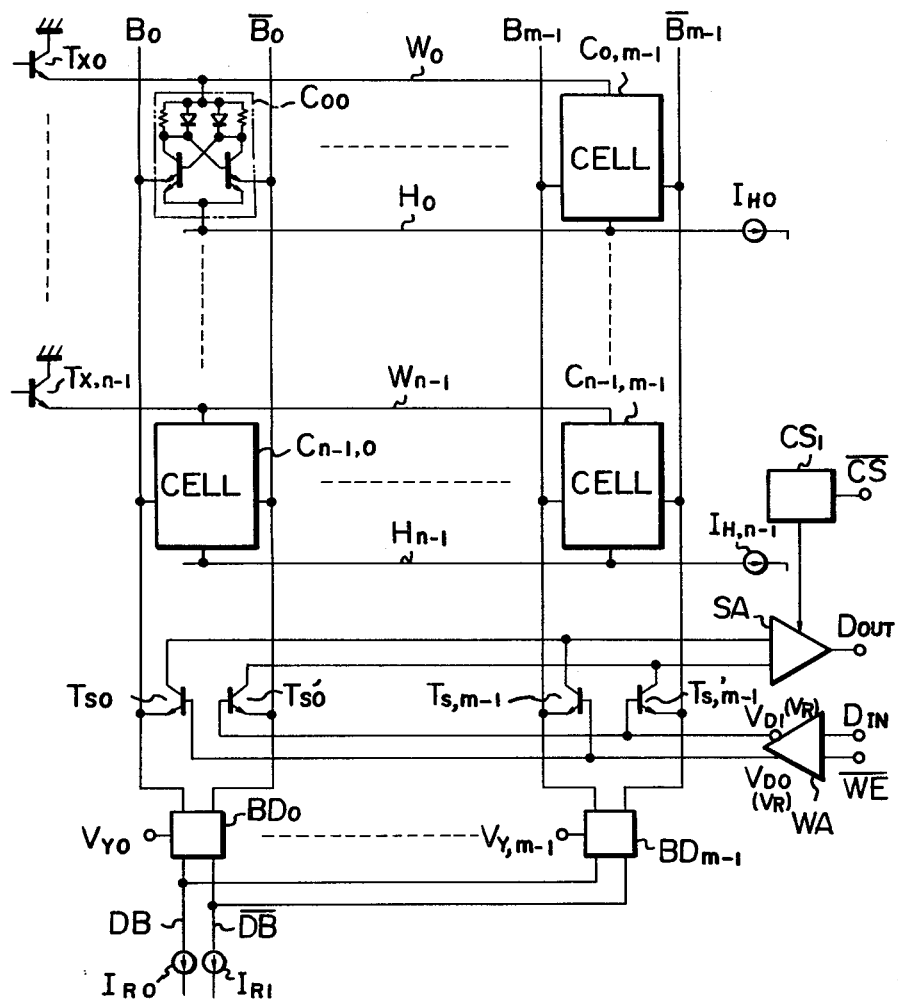
FIG. 1 is a block circuit diagram illustrating a conventional bipolar semiconductor memory device.

In FIG. 1, which illustrates a conventional bipolar semiconductor memory device, the bipolar semiconductor memory device comprises memory cells $C_{00}, \ldots, C_{0,m-1}, \ldots, C_{n-1,0}, \ldots, C_{n-1,m-1}$ in n rows by m columns. Each memory cell is connected to one of the word lines $W_0, \ldots, W_{n-1}$, to one of the hold lines $H_0, \ldots, H_{n-1}$ and to one of the pairs of bit lines $B_0, \overline{B}_0; \ldots; B_{m-1}, \overline{B}_{m-1}$. The word lines $W_0, \ldots, W_{n-1}$ are connected to word drivers $T_{x0}, \ldots, T_{x,n-1}$, respectively, while the hold lines $H_0, \ldots, H_{n-1}$ are connected to constant current sources $I_{H0}, \ldots, I_{H,n-1}$, respectively. Further, pairs of sensing transistors $T_{S0}, T_{S0}'; \ldots; T_{S,m-1}, T_{S,m-1}'$ are connected to the pairs of bit lines $B_0, \overline{B}_0; \ldots; B_{m-1}, \overline{B}_{m-1}$, respectively. The bit lines are connected through bit line drivers $BD_0, \ldots, BD_{m-1}$, respectively, to data bit lines DB and $\overline{DB}$ which are also connected to constant current sources $I_{R0}$ and $I_{R1}$, respectively.

A sense amplifier SA, which is activated by a chip selection circuit $CS_1$, detects the data stored in the memory cells $C_{00}, \ldots, C_{n-1,m-1}$ and generates a data signal $D_{OUT}$. In this case, the chip selection circuit $CS_1$ receives the inverted signal $\overline{CS}$ of a chip selection signal. On the other hand, a write amplifier WA receives a data input signal $D_{IN}$ and the inverted signal $\overline{WE}$ of a write enable signal. During a read mode, when the potential of the signal $\overline{WE}$ is high, the write amplifier WA generates two output signals having the same read reference potential $V_R$, regardless of the data input signal $D_{IN}$. However, during a write mode when the potential of the signal $\overline{WE}$ is low, the write amplifier WA generates two output signals having different potentials $V_{D0}$ and $V_{D1}$ in response to the potential of the data input signal $D_{IN}$.

Figure 2A:
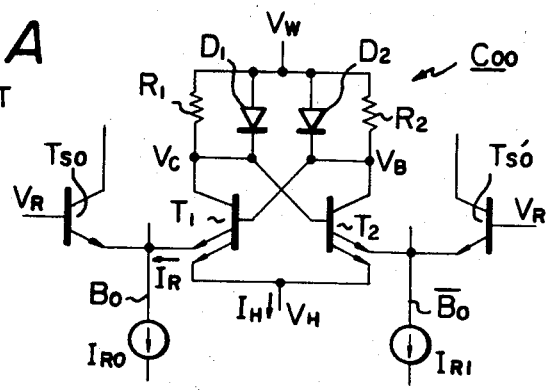
FIG. 2A is a circuit diagram of a memory cell $C_{00}$ of FIG. 1.

FIG. 2A is a circuit diagram of the memory cell $C_{00}$ or internal circuit of FIG. 1. The memory cell $C_{00}$ is of a flip-flop type which comprises two multi-emitter transistors $T_1$ and $T_2$ with bases and collectors cross-coupled to form a bistable circuit. Each of the transistors $T_1$ and $T_2$ has one emitter connected to one emitter of the other, while the other of the emitters is connected to the bit line $B_0$ or $\overline{B}_0$. $R_1$ and $R_2$ are resistors, and $D_1$ and $D_2$ are diodes (for example, Schottky barrier diodes) for clamping the collector potentials of the transistors $T_1$ and $T_2$. Therefore, the transistors $T_1$ and $T_2$ do not enter into a saturation state. $V_W$ and $V_H$ are potentials of the word line $W_0$ and the hold line $H_0$, respectively, and $V_C$ and $V_B$ are potentials of the collector and the base of the transistor $T_1$.

Figure 2B:
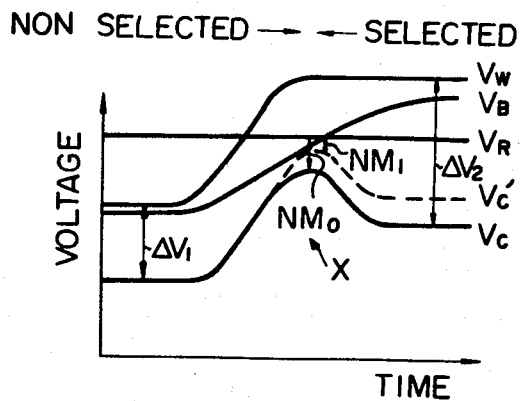
FIG. 2B is a timing diagram illustrating signals appearing in the circuit of FIG. 2A.

Referring to FIG. 2B, the operation of the circuit of FIG. 2A will now be explained. Assume that the transistors $T_1$ and $T_2$ are turned on and off, respectively. When the potential $V_W$ is changed from low (non-selected state) to high (selected state), the base potential $V_B$ rises slowly, while the collector potential $V_C$ rises quickly for a short time, as indicated by an arrow X. The reason for this will now be explained.

In the circuit of FIG. 2A, the resistors $R_1$ and $R_2$ are large enough to reduce the hold current $I_H$ in the non-selected state; however, in this case, in the selected state, the read current $I_R$ is so small that it takes a long time to charge the bit lines $B_0$ and $\overline{B}_0$. To avoid this, the diodes $D_1$ and $D_2$ are arranged parallel to the resistors $R_1$ and $R_2$, respectively. Therefore, in the non-selected state, the diodes $D_1$ and $D_2$ are in an off-state and accordingly, the difference $\Delta V_1$ between the potentials $V_W$ and $V_C$ is represented by $$\Delta V_1 = R_1 \times I_H \cong 300 \text{ mV}$$

However, in the selected state, the diode $D_1$ is turned on so that the difference $\Delta V_2$ between the potentials $V_W$ and $V_C$ is equal to the forward voltage of the diode $D_1$. This forward voltage is 0.7 to 0.8 V in a state when a sufficient current flows through the diode $D_1$, while the forward voltage is smaller than 0.7 to 0.8 V in a state when a small current flows through the diode $D_1$. Since the transistor $T_1$ is in an on-state, $V_B > V_R$ should be satisfied in order to for the read current $I_R$ to flow through the emitter of the transistor $T_1$ to the bit line $B_0$. In this case, when $V_B = V_R$, the read current $I_R$ equals $I_{R0}/2$, and when $V_B > V_R$ or $V_B < V_R$, the read current $I_R$ equals $I_{R0}$ or zero. Therefore, when $V_B < V_R$ (non-selected), no current $I_R$ flows and accordingly, the collector potential $V_C$ is pulled up by the resistor $R_1$ and the diode $D_1$. That is, the collector potential $V_C$ follows the word line potential $V_W$, as illustrated in FIG. 2B. As the collector potential $V_C$ is increased, the collector of the transistor $T_1$ and the base of the transistor $T_2$ are charged. In this case, due to the large resistance of the resistor $R_1$, the charging current which is a collector current of the transistor $T_1$ is so large that the diode $D_1$ is turned on. As a result, the collector potential $V_C$ is rapidly increased, as indicated by the arrow X in FIG. 2B. Accordingly, as the base potential $V_B$ approaches the read reference potential $V_R$, the read current $I_R$ begins to flow, so that the collector potential $V_C$ is again pulled down to a level which is determined by the diode $D_1$ in the selected state. Thus, the collector potential $V_C$ rises once and then falls.

On the other hand, the collector of the transistor $T_2$ and the base of the transistor $T_1$ are also charged by the current flowing through the resistor $R_2$; however, in this case, since the base potential $V_B$ is high in the non-selected state, the current flowing through the resistor $R_2$, which is a base current of the transistor $T_1$, is not large enough to turn on the diode $D_2$. Therefore, the base potential $V_B$ rises slowly and, in addition, since the transistor $T_2$ is turned off, the potential $V_B$ rises linearly.

As illustrated in FIG. 2B, the collector potential $V_C$ has a peak characteristic and, accordingly, there is a problem in that the maximum of the collector potential $V_C$ approaches the read reference potential $V_R$. That is, the collector potential may rise as indicated by a dotted line $V_C'$, because of the fluctuation characteristics of the diodes $D_1$ and $D_2$, and this causes a rise in the temperature of the chip or the like. At the worst, if $V_C > V_R$, in a current switch formed by the transistors $T_2$ and $T_{S0'}$, the transistor $T_2$ is turned on and, in turn, the transistor $T_1$ is turned off, which may change the memory content stored in the cell $C_{00}$. Therefore, the value $(V_R - V_C)$ is called a noise margin. For example, in FIG. 2B, $NM_0$ is a noise margin at room temperature, while $NM_1$ is a noise margin at a high temperature.

Figure 2C:
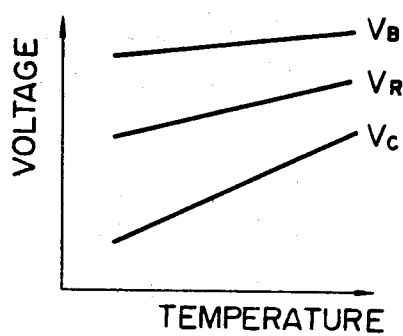
FIG. 2C is a graph illustrating read reference potential $V_R$ of FIG. 2A.

As illustrated in FIG. 2C, in order to increase the noise margin, the value $V_R$ is set at an intermediate level between the base potential $V_B$ and the collector potential $V_C$ of memory cell or internal circuit; however, as the temperature rises, the difference between the potentials $V_B$ and $V_C$ becomes smaller, so that the noise margin also becomes smaller.

In a test for a finished semiconductor device, it is desirable to conduct such a test under adverse conditions. For example, such a test could be carried out at a high temperature. In other words, in a state where the noise margin is small, the device should be checked whether there is a cell in which $V_C > V_R$. However, in order to carry out such a test, a process for heating up a chip and various measuring steps are necessary, so that the cost of testing is high.

In FIG. 2B, note that the potential $V_R$ can be shifted toward the word line potential $V_W$, in order to increase the noise margin; however, in this case, the difference between the potentials $V_R$ and $V_B$ becomes small, so that it is difficult to obtain read outputs at the bit lines $B_0$ and $\overline{B}_0$. In conclusion, it is desirable that the potential $V_R$ be set at an intermediate level between the potentials $V_B$ and $V_C$ in the selected state, as mentioned above.

In a semiconductor device, such as a bipolar semiconductor memory device, it is necessary to check whether $V_C > V_R$ is satisfied when the state is changed from non-selected to selected under an adverse condition, such as a high temperature condition.

Figure 3A:
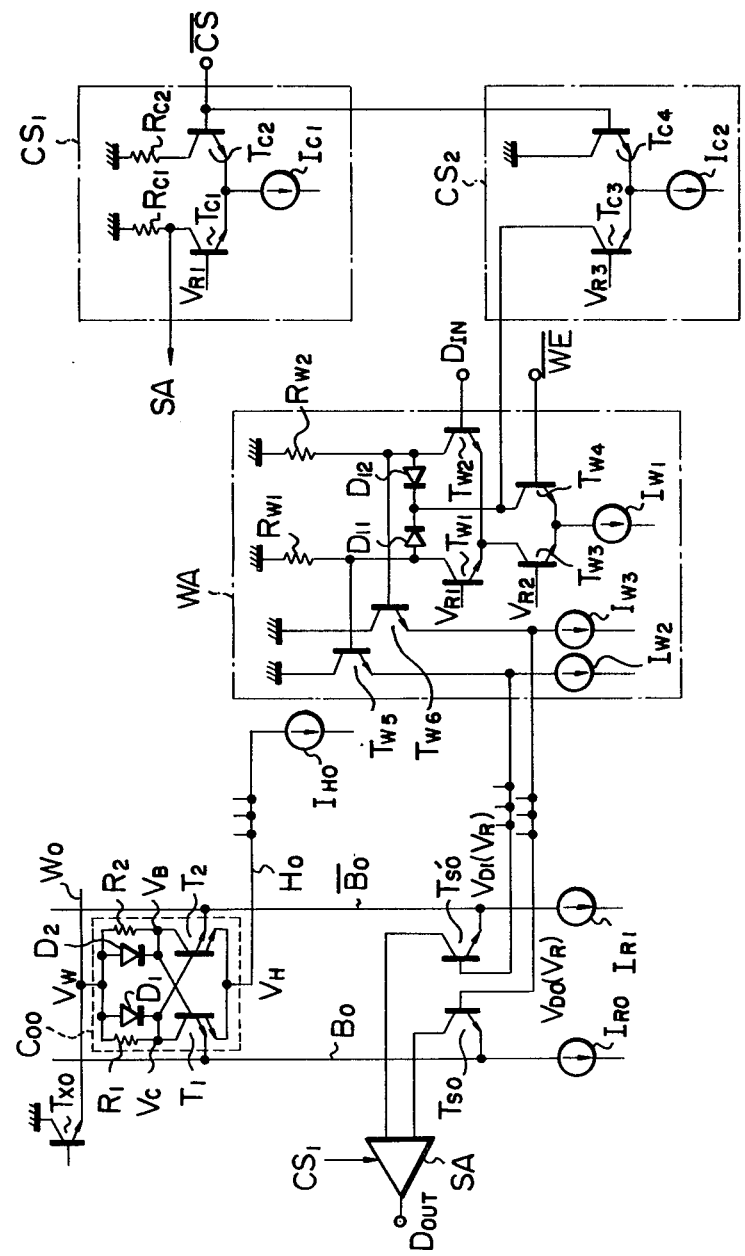
FIG. 3A is a circuit diagram illustrating a first embodiment of a bipolar semiconductor memory device according to the present invention.

FIG. 3A is a circuit diagram illustrating a first embodiment of a bipolar semiconductor memory device according to the present invention. In FIG. 3A, the elements which are the same as those of FIGS. 1 and 2A are denoted by the same reference characters. However, a circuit $CS_2$ for decreasing the read reference potential $V_R$ in the test mode is added between the chip selection circuit $CS_1$ and the write amplifier WA.

In more detail, the chip selection circuit $CS_1$ comprises resistors $R_{C1}$ and $R_{C2}$, a transistor $T_{C1}$ having a base to which a reference potential $V_{R1}$ ($\cong -1.3$ V) is applied, a transistor $T_{C2}$ having a base to which the inverted signal $\overline{CS}$ of a chip selection signal is supplied, and a constant current source $I_{C1}$. In this case, the transistors $T_{C1}$ and $T_{C2}$ form a current switch with respect to the constant current source $I_{C1}$. The chip selection circuit $CS_1$ controls the sense amplifier SA. That is, when the potential of the signal $\overline{CS}$ is lower than the reference potential $V_{R1}$, the transistors $T_{C1}$ and $T_{C2}$ are turned on and off, respectively, so that the low potential of the collector of the transistor $T_{C1}$ activates the sense amplifier SA.

The write amplifier WA comprises transistors $T_{W1}$ through $T_{W6}$, resistors $R_{W1}$ and $R_{W2}$, diodes $D_{11}$ and $D_{12}$, and constant current sources $I_{W1}$, $I_{W2}$ and $I_{W3}$. In this case, the transistors $T_{W1}$ and $T_{W2}$ form a current switch with respect to the constant current source $I_{W1}$, while the transistors $T_{W3}$ and $T_{W4}$ also form a current switch with respect to the constant current source $I_{W1}$. During the read mode, when the potential of the inverted signal $\overline{WE}$ is higher than a reference potential $V_{R2}$, the transistor $T_{W4}$ is turned on, so that an equivalent voltage $(R_{W1} \times \frac{1}{2}I_{W1} = R_{W2} \times \frac{1}{2}I_{W1})$ is generated at each of the resistors $R_{W1}$ and $R_{W2}$ through the diodes $D_{11}$ and $D_{12}$. As a result, the base potentials $V_{D0}$ and $V_{D1}$ of the sensing transistors $T_{S0}$ and $T_{S0}'$ are the same as the read reference potential $V_R$ produced by the emitter-follower transistors $T_{W5}$ and $T_{W6}$. However, during the write mode when the potential of the signal $\overline{WE}$ is lower than the reference potential $V_{R2}$, the transistor $T_{W3}$ is turned on and in addition, one of the transistors $T_{W1}$ and $T_{W2}$ is turned on in response to the data input signal $D_{IN}$. For example, if the potential of the signal $D_{IN}$ is lower than a reference potential $V_{R1}$, the transistor $T_{W1}$ is turned on, while, if the potential of the signal $D_{IN}$ is higher than the reference potential $V_{R1}$, the transistor $T_{W2}$ is turned on. Therefore, the base potentials $V_{D0}$ and $V_{D1}$ of the transistors $T_{S0}$ and $T_{S0}'$ are different from each other. The reference potential $V_{R2}$ is, for example, $-2.1$ V.

Figure 3B:
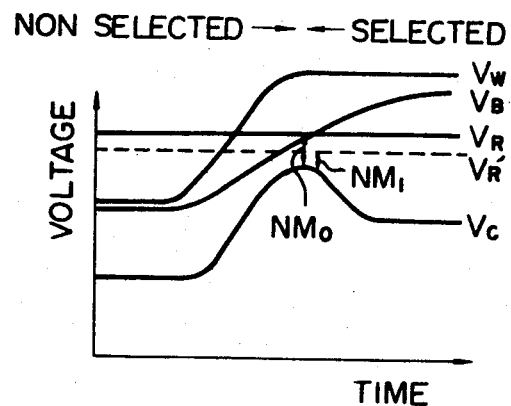
FIG. 3B is a timing diagram illustrating signals appearing in the circuit of FIG. 3A.

The circuit $CS_2$, for decreasing the read potential $V_R$ in the test mode, comprises two transistors $T_{C3}$ and $T_{C4}$ and a constant current source $I_{C2}$. In this case, the transistors $T_{C3}$ and $T_{C4}$ form a current switch with respect to the constant current source $I_{C2}$. The base of transistor $T_{C4}$ is commonly connected to the base of the transistor $T_{C2}$ of the chip selection circuit $CS_1$ and, accordingly, the base of the transistor $T_{C4}$ receives the chip selection signal $\overline{CS}$. The collector of the transistor $T_{C3}$ is commonly connected to the collector of the transistor $T_{W4}$ of the write amplifier WA. A reference potential $V_{R3}$, which is applied to the base of the transistor $T_{C3}$, is much lower than the other reference potentials $V_{R1}$ and $V_{R2}$. Therefore, if the chip selection signal $\overline{CS}$ has a usual or normal level, the potential of the signal $\overline{CS}$ is never lower than the reference potential $V_{R3}$, so that the transistor $T_{C3}$ is always cut off. That is, during the usual or normal mode, the presence of the circuit $CS_2$ has no effect. Therefore, a read reference potential $V_R$ having a sufficient noise margin $NM_0$ with regard to the collector potential $V_C$, as illustrated in FIG. 3B, is applied to the bases of the transistors $T_{S0}$ and $T_{S0}'$.

During the test mode, the potential of the signal $\overline{CS}$ is much lower than the usual high and low levels (non-selected and selected levels), that the potential of the signal $\overline{CS}$ is lower than the reference potential $V_{R3}$. As a result, the transistor $T_{C3}$ is turned on, so that an equivalent current flows through each of the resistors $R_{W1}$ and $R_{W2}$ and each of the diodes $D_{11}$ and $D_{12}$. The equivalent currents both flow into the constant current source $I_{C2}$. Therefore, if $I_{C2} > I_{W1}$, the voltage drop in the resistors $R_{W1}$ and $R_{W2}$ ($R_{W1} \times \frac{1}{2}I_{C2} = R_{W2} \times \frac{1}{2}I_{C2}$) is larger than the voltage drop in these resistors when the transistor $T_{W4}$ is turned on during the read mode. As a result, the read reference potential $V_R'$, that is, each of the base potentials of the sensing transistors $T_{S0}$ and $T_{S0}'$, is lower than the read reference potential $V_R$ during the usual or normal mode, as illustrated in FIG. 3B. However, it should be noted that, even during the test mode, the potential of the signal $\overline{WE}$ is high, so that the currents $I_{C2}$ and $I_{W1}$ flow through the resistors $R_{W1}$ and $R_{W2}$. Therefore, the read reference potential $V_R'$ during the test mode is lower than the read reference potential $V_R$ during the normal mode, without necessitating the condition $I_{C2} > I_{W1}$. Therefore, when the read operation is carried out by the read reference potential $V_R'$, the noise margin with respect to the collector potential $V_C$ of the memory cell or internal circuit is indicated by $NM_1$ in FIG. 3B. This noise margin $NM_1$ corresponds to a high temperature state. Therefore, without forcing the chip to be in a high temperature state, the checking or testing of the device at a high temperature state can be carried out at room temperature.

Figure 4B:
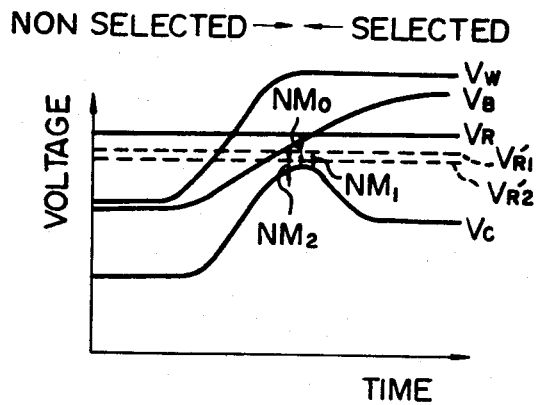
FIG. 4B is a timing diagram illustrating signals appearing in the circuit of FIG. 4A.
Figure 4A:
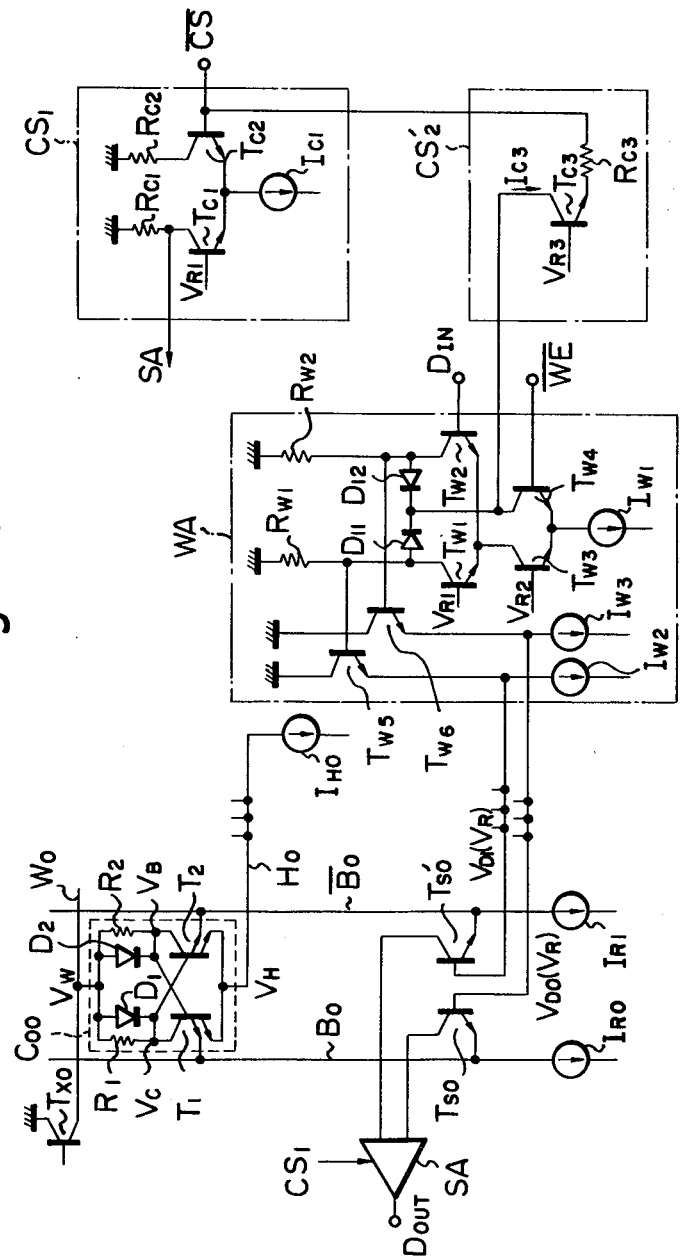
FIG. 4A is a circuit diagram illustrating a second embodiment of the bipolar semiconductor memory device according to the present invention.

FIG. 4A is a circuit diagram illustrating a second embodiment of the bipolar semiconductor memory device according to the present invention. In FIG. 4A, the elements which are the same as those of FIG. 3A are denoted by the same reference characters. In FIG. 4A, the circuit $CS_2'$ for decreasing the read potential $V_R$ in the test mode comprises a resistor $R_{C3}$ instead of the transistor $T_{C4}$ and the constant current source $I_{C3}$ of FIG. 3A. In FIGS. 3A and 3B, the read reference potential $V_R'$ corresponding to a high temperature state can not be arbitrarily changed, even if the potential of the signal $\overline{CS}$ is changed. Contrary to this, in FIG. 4A, the read reference potential $V_R'$ corresponding to a high temperature state can be arbitrarily changed by changing the potential of the signal $\overline{CS}$. That is, in FIG. 4B, the read reference potential $V_{R1}'$ and $V_{R2}'$ correspond to a first high temperature state and a second high temperature state, respectively. In this case, the first high temperature is lower than the second high temperature.

In FIG. 4A, the reference potential $V_{R3}$ is determined so as to cut off the transistor $T_{C3}$ when the potential of the signal $\overline{CS}$ is at a usual level, which is different from a test level. During the test mode, the potential of the signal $\overline{CS}$ is lower than a value $(V_{R3} - V_{BE})$ where $V_{BE}$ is the potential between the base and the emitter of the transistor $T_{C3}$, so that the collector current $I_{C3}$ to flows through the transistor $T_{C3}$. This current $I_{C3}$ is represented by $$I_{C3} = \frac{V_{R3} - V_{CS} - V_{BE}}{R_{C3}}$$

where $V_{CS}$ is the potential of the signal $\overline{CS}$ and $V_{BE}$ is a base-emitter voltage of the transistor $T_{C3}$. Then the current $I_{C3}$ is changed by changing the potential $V_{CS}$, which also changes the each voltage drop in the resistors $R_{W1}$ and $R_{W2}$. Thus, the read reference potential $V_R$ can be arbitrarily changed, as illustrated in FIG. 4B. Thus, checking or testing of the device of FIG. 4A at various high temperature states can be carried out at room temperature.

Figure 5:
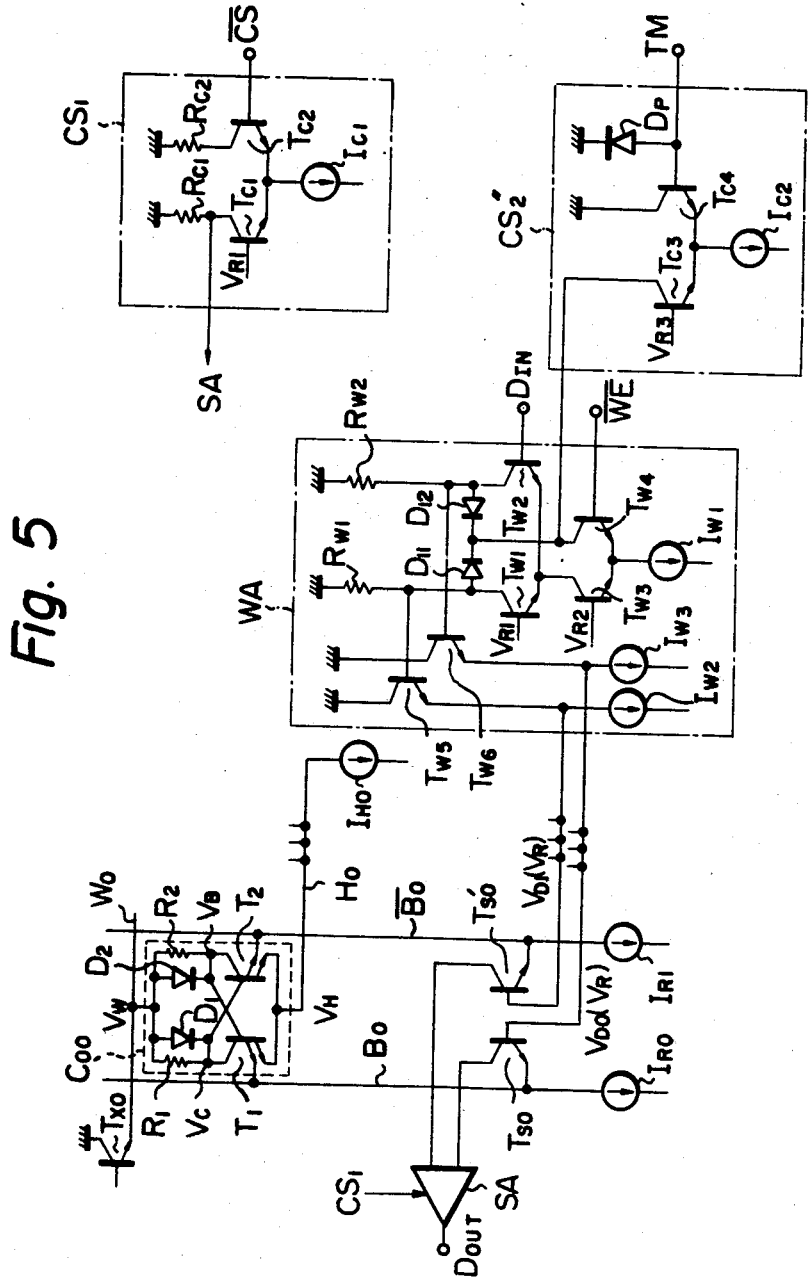
FIG. 5 is a circuit diagram illustrating a third embodiment of the bipolar semiconductor memory device according to the present invention.

FIG. 5 is a circuit diagram illustrating a third embodiment of the bipolar semiconductor memory device according to the present invention. In FIG. 5, the elements which are the same as those of FIG. 4A are denoted by the same reference characters. In FIG. 5, the base of the transistor $T_{C4}$ of the circuit $CS_2''$ is connected to a programmable element or a diode $D_p$ and to an external terminal TM, but not to the chip selection circuit $CS_1$. That is, during the test mode, the diode $D_p$ is opened so that the potential of the base of the transistor $T_{C4}$ is lower than the reference potential $V_{R3}$. As a result, the transistor $T_{C3}$ remains conductive. After testing, that is, during the usual or normal mode, the terminals of the diode $D_p$ are closed, so that the transistor $T_{C4}$ is turned off. Thus, the operation of the circuit of FIG. 5 is similar to that of the circuit of FIG. 3A.

Figure 6A:
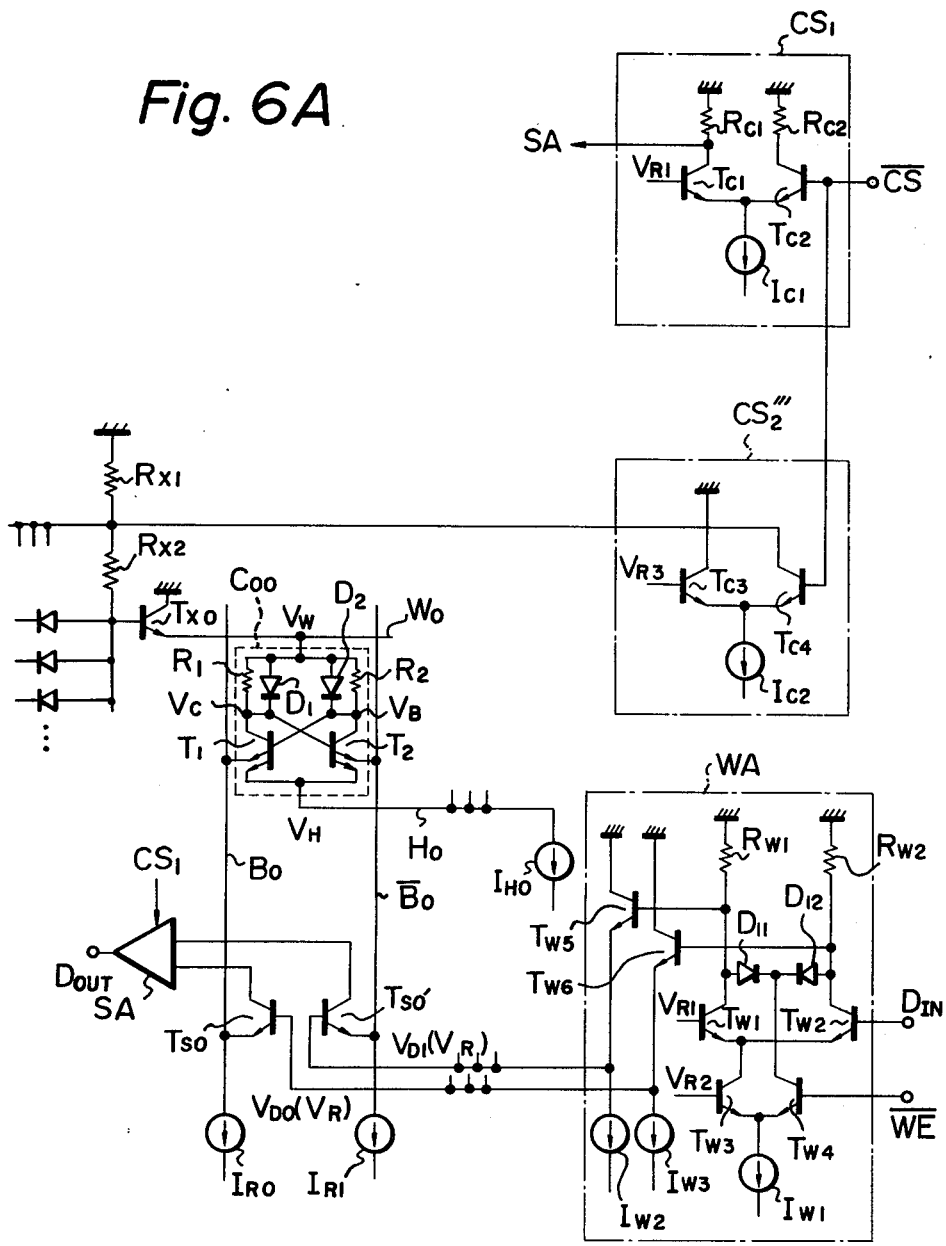
FIG. 6A is a circuit diagram illustrating a fourth embodiment of the bipolar semiconductor memory device according to the present invention.

FIG. 6A is a circuit diagram illustrating a fourth embodiment of the bipolar semiconductor memory device according to the present invention. In FIG. 6A, the elements which are the same as those of FIG. 3A are denoted by the same reference characters. In FIG. 6A, a circuit $CS_2'''$ for increasing the potential of the word line $W_0$, which is similar to the circuit $CS_2$ of FIG. 3A, is provided. The circuit $CS_2'''$ also comprises two transistors $T_{C3}$ and $T_{C4}$ and a constant current source $I_{C2}$. A reference potential $V_{R3}$ is applied to the base of the transistor $T_{C3}$, while the chip selection signal $\overline{CS}$ is supplied to the base of the transistor $T_{C4}$. Note that a resistor $R_{X1}$ is connected to a resistor $R_{X2}$ of the word driver $T_{X0}$.

Figure 6B:
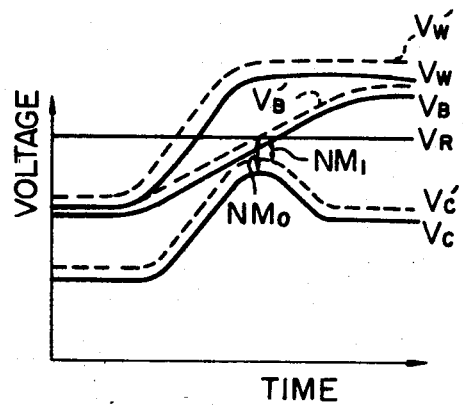
FIG. 6B is a timing diagram illustrating signals appearing in the circuit of FIG. 6A.

During the normal mode when the potential of the signal $\overline{CS}$ is higher than the reference potential $V_{R3}$, the transistor $T_{C4}$ is turned on, so that the base potential of the word driver $T_{X0}$ is low as compared with the ground level. Contrary to this, during the test mode when the potential $\overline{CS}$ is lower than the reference potential $V_{R3}$, the transistor $T_{C4}$ is cut off, so that the base potential of the word driver $T_{X0}$ rises toward the ground level. As a result, as illustrated in FIG. 6A, the word line potential $V_W'$, the base potential $V_B'$ and the collector potential $V_C'$ of the memory cell or internal circuit during the test mode are higher than the word line potential $V_W$, the base potential $V_B$ and the collector potential $V_C$ during the usual or normal mode, respectively, as illustrated in FIG. 6B. However, the read reference potential $V_R$ is not changed regardless of the normal and test modes, since the read reference potential $V_R$ is determined by the write amplifier WA. Therefore, the noise margin $NM_1$ during the test mode is smaller than the noise margin $NM_0$ during the usual mode. Note that this small noise margin $NM_1$ corresponds to a high temperature state. Thus, the checking or testing of the device of FIG. 6A at a high temperature state can be carried out at room temperature.

It should be noted that the present invention can be applied to a MOS (broadly, MIS) semiconductor device as well as the bipolar semiconductor device.

As explained hereinbefore, the semiconductor device according to the present invention has an advantage in that the checking or testing of the device at a high temperature state can be carried out at room temperature, since the noise margin is decreased by decreasing the read reference potential or by increasing the word line potential. Therefore, the manufacturing cost for the semiconductor device is low.

I claim:

1. A semiconductor device having normal and test modes, comprising:
    an internal circuit for generating at least one internal signal;
    means for generating a reference signal;
    means, operatively connected to said internal circuit and to said reference signal generating means, for sensing the difference in potential between said internal signal and said reference signal; and
    means for changing the difference in potential between said internal signal and said reference signal, where the difference in the normal mode is different from that in the test mode.

2. A semiconductor device as set forth in clam 1, wherein said changing means comprises means, operatively connected to said reference signal generating means, for decreasing the potential of said reference signal in the test mode, rather than in the normal mode.

3. A semiconductor device as set forth in claim 1, wherein said changing means comprises means, operatively connected to said internal circuit, for increasing the potential of said internal signal in the test mode, rather than in the normal mode.

4. A semiconductor device having normal and test modes, comprising:
    a plurality of word lines;
    a plurality of hold lines;
    a plurality of pairs of bit lines;
    a plurality of word drivers each operatively connected to one of said word lines;
    a plurality of memory cells for generating an internal signal, each memory cell comprising:
        two multi-emitter transistors having bases and collectors cross-coupled as a bistable circuit and having one emitter of each multi-emitter transistor operatively connected to one of said bit lines and the other emitter of each multi-emitter transistor operatively connected to one of said hold lines; and
        two resistors operatively connected to said multi-emitter transistors and to one of said word lines;
    a plurality of pairs of sensing transistors having emitters operatively connected to one of said pairs of bit lines and having bases;
    means, operatively connected to the bases of said sensing transistors, for generating a read reference potential for the bases of said sensing transistors; and
    means for changing the difference in potential between said internal signal and said read reference potential, where the difference in the normal mode is different from that in the test mode.

5. A semiconductor device as set forth in claim 4, wherein said changing means comprises means, operatively connected to said reference potential generating means, for decreasing said read reference potential in the test mode, rather than in the normal mode.

6. A semiconductor device as set forth in claim 4, wherein said changing means comprises means, operatively connected to said word drivers, for increasing the potentials of said word lines in the test mode, rather than in the normal mode.

7. A semiconductor device having normal and test modes and operatively connectable to receive a write enable signal and a data input signal, comprising:
    a plurality of word lines;
    a plurality of hold lines;
    a plurality of pairs of bit lines;
    a plurality of word drivers each operatively connected to one of said word lines;
    a plurality of memory cells for generating an internal signal, each memory cell comprising:
        two multi-emitter transistors having bases and collectors cross-coupled as a bistable circuit and having one emitter of each multi-emitter transistor operatively connected to one of said bit lines and the other emitter of each multi-emitter transistor operatively connected to one of said hold lines; and
        two resistors operatively connected to said multi-emitter transistors and to one of said word lines;
    a plurality of pairs of sensing transistors having emitters operatively connected to one of said pairs of bit lines and having bases;
    means, operatively connected to the bases of said sensing transistors, for generating a read reference potential for the bases of said sensing transistors, said read reference potential generating means comprising a write amplifier, operatively connectable to receive the write enable signal and the data input signal and operatively connected to the bases of said sensing transistors, for receiving the write enable signal and the data input signal, and for generating said read reference potential for the bases of said sensing transistors when the potential of the write enable signal is a potential in a read mode; and means for changing the difference in potential between said internal signal and said read reference potential, where the difference in the normal mode is different from that in the test mode.

8. A semiconductor device having normal and test modes and operatively connectable to receive a first reference potential and a chip selection potential, comprising:

a plurality of word lines;
a plurality of hold lines;
a plurality of pairs of bit lines;
a plurality of word drivers each operatively connected to one of said word lines;
a plurality of memory cells for generating an internal signal, each memory cell comprising:
two multi-emitter transistors having bases and collectors cross-coupled as a bistable circuit and having one emitter of each multi-emitter transistor operatively connected to one of said bit lines and the other emitter of each multi-emitter transistor operatively connected to one of said hold lines; and
two resistors operatively connected to said multi-emitter transistors and to one of said word lines;
a plurality of pairs of sensing transistors having emitters operatively connected to one of said pairs of bit lines and having bases;
means, operatively connected to the bases of said sensing transistors, for generating a read reference potential for the bases of said sensing transistors; and
means for changing the difference in potential between said internal signal and said read reference potential, where the difference in the normal mode is different from that in the test mode, said changing means comprising means, operatively connected to said reference potential generating means, for decreasing said read reference potential in the test mode, rather than in the normal mode, said read reference potential decreasing means comprising:
a first transistor having an emitter, a collector operatively connected to said read reference potential generating means and a base for receiving the first reference potential;
a second transistor having an emitter and a base for receiving the chip selection signal; and
a constant current source operatively connected to the emitters of said first and second transistors; and
the base potential of said second transistor being lower than the first reference potential when in the test mode.

9. A semiconductor device having normal and test modes and operatively connectable to receive a first reference potential and a chip selection signal, comprising:

a plurality of word lines;
a plurality of hold lines;
a plurality of pairs of bit lines;
a plurality of word drivers each operatively connected to one of said word lines;
a plurality of memory cells for generating an internal signal, each memory cell comprising:
two multi-emitter transistors having bases and collectors cross-coupled as a bistable circuit and having one emitter of each multi-emitter transistor operatively connected to one of said bit lines and the other emitter of each multi-emitter transistor operatively connected to one of said hold lines; and
two resistors operatively connected to said multi-emitter transistors and to one of said word lines;
a plurality of pairs of sensing transistors having emitters operatively connected to one of said pairs of bit lines and having bases;
means, operatively connected to the bases of said sensing transistors, for generating a read reference potential for the bases of said sensing transistors; and
means for changing the difference in potential between said internal signal and said read reference potential, where the difference in the normal mode is different from that in the test mode, said changing means comprising means, operatively connected to said reference potential generating means, for decreasing said read reference potential in the test mode, rather than in the normal mode, said read reference potential decreasing means comprising:
a first transistor having an emitter, a collector operatively connected to said read reference potential generating means and a base for receiving the first reference potential; and
a first load, operatively connected to the emitter of said first transistor and operatively connectable to receive the chip selection signal; and
the emitter potential of said first transistor being lower than the first reference potential when in the test mode.

10. A semiconductor device having normal and test modes and operatively connectable to receive a first reference potential and having an external terminal, comprising:

a plurality of word lines;
a plurality of hold lines;
a plurality of pairs of bit lines;
a plurality of word drivers each operatively connected to one of said word lines;
a plurality of memory cells for generating an internal signal, each memory cell comprising:
two multi-emitter transistors having bases and collectors cross-coupled as a bistable circuit and having one emitter of each multi-emitter transistor operatively connected to one of said bit lines and the other emitter of each multi-emitter transistor operatively connected to one of said hold lines; and
two resistors operatively connected to said multi-emitter transistors and to one of said word lines;
a plurality of pairs of sensing transistors having emitters operatively connected to one of said pairs of bit lines and having bases;
means, operatively connected to the bases of said sensing transistors, for generating a read reference potential for the bases of said sensing transistors; and means for changing the difference in potential, where the difference in the normal mode is different from that in the test mode, said changing means comprising means, operatively connected to said reference potential generating means, for decreasing said read reference potential in the test mode, rather than in the normal mode, said read reference potential decreasing means comprising:
- a first transistor having an emitter, a collector operatively connected to said read reference potential generating means and a base for receiving the first reference potential;
- a second transistor having a base and an emitter;
- a constant current source operatively connected to the emitters of said first and second transistors; and
- a programmable element operatively connected to the base of said second transistor and to the external terminal, said programmable element being opened and closed in the test mode and the normal mode, respectively.

11. A semiconductor device as set forth in claim 10, wherein said programmable element is a diode.

12. A semiconductor device having normal and test modes and operatively connectable to receive a first reference potential and a chip selection signal, comprising:
- a plurality of word lines;
- a plurality of hold lines;
- a plurality of pairs of bit lines;
- a plurality of word drivers each operatively connected to one of said word lines;
- a plurality of memory cells for generating an internal signal, each memory cell comprising:
  - two multi-emitter transistors having bases and collectors cross-coupled as a bistable circuit and having one emitter of each multi-emitter transistor operatively connected to one of said bit lines and the other emitter of each multi-emitter transistor operatively connected to one of said hold lines; and
  - two resistors operatively connected to said multi-emitter transistors and to one of said word lines;
- a plurality of pairs of sensing transistors having emitters operatively connected to one of said pairs of bit lines and having bases;
- means, operatively connected to the bases of said sensing transistors, for generating a read reference potential for the bases of said sensing transistors; and
- means for changing the difference in potential between said internal signal and said read reference potential, where the difference in the normal mode is different from that in the test mode, said changing means comprising means, operatively connected to said word drivers, for increasing the potentials of said word lines in the test mode, rather than in the normal mode, said word line potential increasing means comprising:
  - a third resistor operatively connected to said word drivers;
  - a first transistor having an emitter and a base for receiving the first reference potential;
  - a second transistor having an emitter, a collector operatively connected to said third resistor and a base for receiving the chip selection signal; and
  - a constant current source operatively connected to the emitters of said first and second transistors; and
- the base potential of said second transistor being lower than the first reference potential in the test mode.

* * * * *

UNITED STATES PATENT AND TRADEMARK OFFICE
CERTIFICATE OF CORRECTION

PATENT NO. : 4,459,686
DATED : July 10, 1984
INVENTOR(S) : Kazuhiro Toyoda

It is certified that error appears in the above-identified patent and that said Letters Patent is hereby corrected as shown below:

Column 2, line 3, after "read", insert --a--;
line 39, "$B_{01}$" should be --$B_0$--;
"$\overline{B0}$" should be --$\overline{B}_0$--.

Column 5, line 49, after ",", insert --so--.

Signed and Sealed this

*Twenty-sixth* Day of *March 1985*

[SEAL]

Attest:

DONALD J. QUIGG

*Attesting Officer*      *Acting Commissioner of Patents and Trademarks*